US010621040B2

(12) United States Patent
Yoon et al.

(10) Patent No.: US 10,621,040 B2
(45) Date of Patent: Apr. 14, 2020

(54) MEMORY CONTROLLERS TO FORM SYMBOLS BASED ON BURSTS

(71) Applicant: HEWLETT PACKARD ENTERPRISE DEVELOPMENT LP, Houston, TX (US)

(72) Inventors: Doe Hyun Yoon, Palo Alto, CA (US); Robert Schreiber, Palo Alto, CA (US); Sheng Li, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 898 days.

(21) Appl. No.: 14/648,290

(22) PCT Filed: Nov. 30, 2012

(86) PCT No.: PCT/US2012/067391
§ 371 (c)(1),
(2) Date: May 29, 2015

(87) PCT Pub. No.: WO2014/084855
PCT Pub. Date: Jun. 5, 2014

(65) Prior Publication Data
US 2015/0309873 A1    Oct. 29, 2015

(51) Int. Cl.
*G11C 29/00* (2006.01)
*H03M 13/00* (2006.01)
*G06F 11/10* (2006.01)
*G06F 13/16* (2006.01)
(Continued)

(52) U.S. Cl.
CPC ...... *G06F 11/1076* (2013.01); *G06F 11/1012* (2013.01); *G06F 13/1636* (2013.01); *H03M 13/1515* (2013.01); *G11C 2029/0411* (2013.01); *G11C 2207/105* (2013.01)

(58) Field of Classification Search
CPC ............ G06F 11/1076; G06F 11/1012; G06F 13/1636; H03M 13/1515; G11C 2029/0411; G11C 2207/105
USPC ....... 714/766, 767, 769, 784, 804, 805, 800, 714/799, 763, 746, 752, 6.24, 52
See application file for complete search history.

(56) References Cited

U.S. PATENT DOCUMENTS

| | | | |
|---|---|---|---|
| 5,537,421 A | * | 7/1996 | Dujari ..................... G06F 11/10 714/761 |
| 7,203,890 B1 | * | 4/2007 | Normoyle ........... G06F 11/1016 714/763 |
| 7,530,008 B2 | | 5/2009 | Das et al. |

(Continued)

FOREIGN PATENT DOCUMENTS

CN    1821971    8/2006

OTHER PUBLICATIONS

CN First Office Action dated Oct. 10, 2016, CN Patent Application No. 201280077395.4 dated Oct. 10, 2016, State Intellectual Property Office of the P.R. China, 9 pages.
(Continued)

*Primary Examiner* — Christine T. Tu
(74) *Attorney, Agent, or Firm* — Hewlett Packard Enterprise Patent Department

(57) ABSTRACT

A memory controller is to interface with a memory, associated with a plurality of pins, based on a codeword. The codeword is to include a plurality of n-bit symbols. An n-bit symbol of the codeword is to be formed from a plurality of n bursts over time associated with one of the pins of the memory.

17 Claims, 4 Drawing Sheets

(51) Int. Cl.
*H03M 13/15* (2006.01)
*G11C 29/04* (2006.01)

(56) References Cited

U.S. PATENT DOCUMENTS

| | | |
|---|---|---|
| 8,171,377 B2 | 5/2012 | Dell et al. |
| 8,185,801 B2 | 5/2012 | Dell et al. |
| 2002/0152444 A1 | 10/2002 | Chen et al. |
| 2003/0140300 A1* | 7/2003 | Chen .................. G06F 11/1016 714/763 |
| 2008/0046796 A1 | 2/2008 | Dell et al. |
| 2008/0126905 A1* | 5/2008 | Deguchi ............. G06F 11/1044 714/746 |
| 2008/0140987 A1 | 6/2008 | Rixner et al. |
| 2009/0049365 A1 | 2/2009 | Kim et al. |
| 2010/0287445 A1 | 11/2010 | Dell et al. |
| 2011/0145678 A1 | 6/2011 | Agarwal et al. |
| 2012/0011424 A1 | 1/2012 | Schuette |
| 2012/0096330 A1 | 4/2012 | Przybylski |

OTHER PUBLICATIONS

International Searching Authority, The International Search Report and the Written Opinion, dated Aug. 26, 2013, 11 Pages.
Udipi, A.N. et al., LOT-ECC: Localized and Tiered Reliability Mechanisms for Commodity Memory Systems, Jun. 2012, 12 Pages.
AMD, Bios and Kernel Developer's Guide for AMD NPT Family 0Fh Processors, Publication # 32559, Revision: 3.16, Nov. 2009 (446 pages).
Euoprean Patent Office, Extended European Search Report for Appl. No. 12889067.0 dated Jun. 17, 2016 (6 pages).
Sun Microsystems, OpenSPARC T2 System-On-Chip (SoC) Microarchitecture Specification (Part 1 of 2), May 2008 (527 pages).

\* cited by examiner

MEMORY CONTROLLERS TO FORM SYMBOLS BASED ON BURSTS

BACKGROUND

Reliability is an important challenge in computing systems using memory. However, memory can be a frequent source of system failures. Memory errors may occur in memory chips or memory/subsystem pins. As different memory chip packaging and arrangements are developed, it may become even more important for computing systems to tolerate memory failures.

BRIEF DESCRIPTION OF THE DRAWINGS/FIGURES

DETAILED DESCRIPTION

An example computing system may provide an enhanced memory protection scheme to better tolerate memory errors. A system may include a memory controller to interface with a memory having a plurality of pins. The memory controller may interact with the memory based on a codeword including a plurality of n-bit symbols. An n-bit symbol of the codeword may be formed from a plurality of n bursts over time from one of the plurality of pins of the memory. The codeword may be used to detect and/or correct memory errors, allowing the system to tolerate errors such as chip failures and/or pin failures.

Figure 1:
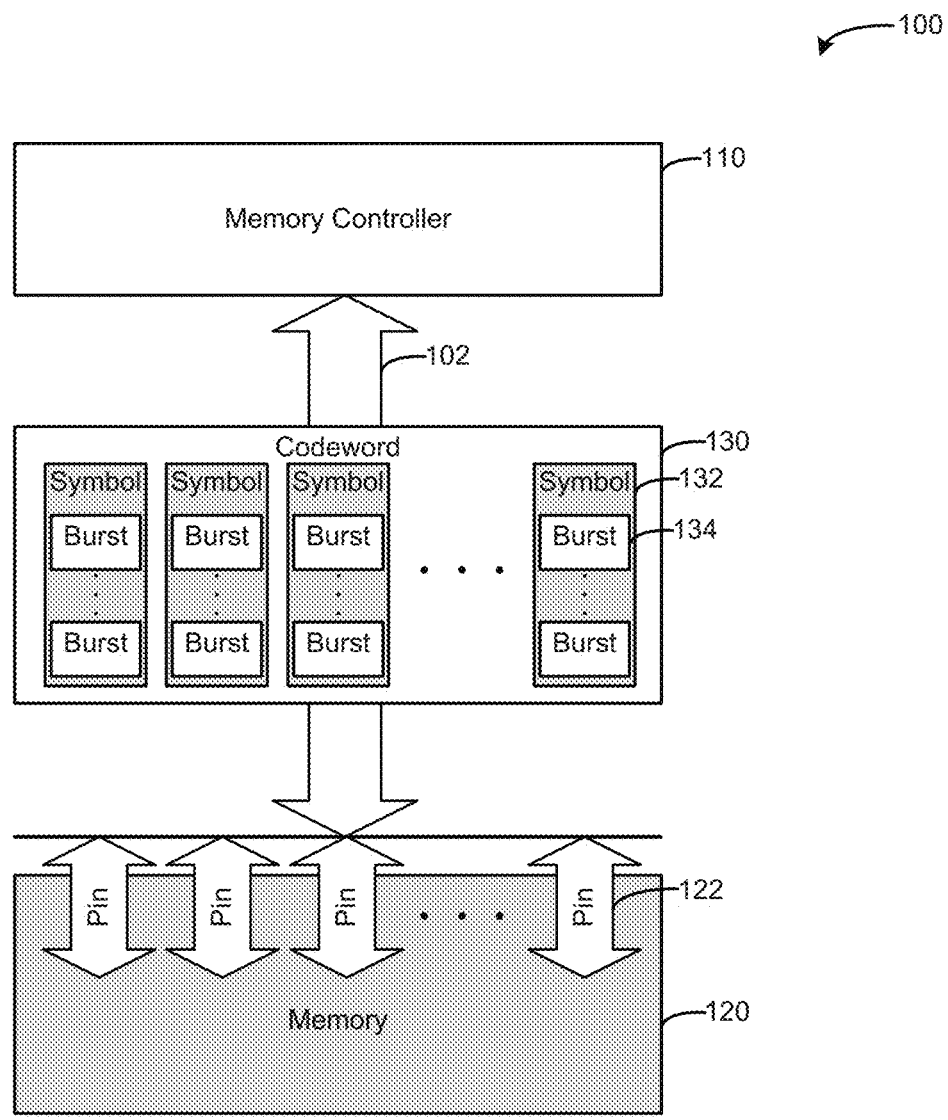
FIG. 1 is a block diagram of a system including a codeword according to an example.

FIG. 1 is a block diagram of a system 100 including a codeword 130 according to an example. Memory controller 110 is coupled to memory 120 via bus 102 (e.g., a data channel) to transmit the codeword 130. The memory 120 may interface with the bus 102 via pins 122. The codeword 130 may include a plurality of symbols 132. A symbol may include a plurality of bursts 134.

Figure 2:
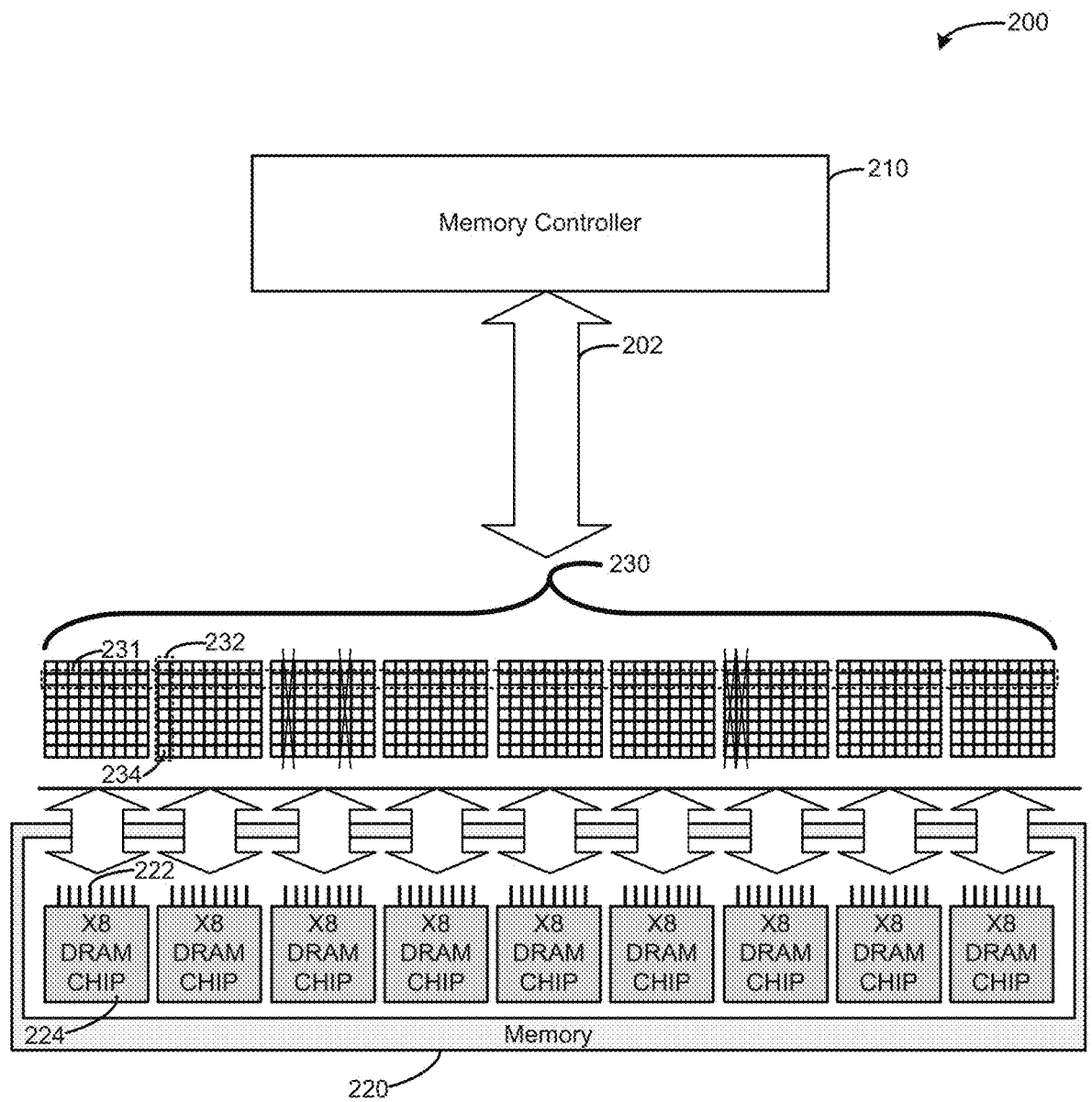
FIG. 2 is a block diagram of a system including a codeword according to an example.

A memory protection mechanism may be enabled by applying a single bit-error correction and double bit-error detection (SEC-DED) code, to tolerate a 1-bit error. For example, SEC-DED may tolerate a pin failure, because a pin failure may appear to be a 1-bit error per access that may be corrected. SEC-DED may use a memory system organization having a 72 bit wide data path, with 64 data pins and 8 ECC pins (e.g., such as shown in FIG. 2).

Memory protection mechanisms also may be symbol-based. The codeword 130 of FIG. 1 may be used to provide error detection and/or correction, based on organization of its symbols 132 and a symbol-based error correcting code (ECC). A symbol 132 may be sized and organized for the ECC to take advantage of the symbol 132. In an example, the symbol size may be 8 bits. A symbol 132 may be a certain number of bits wide. A symbol 132 may be constructed to be, e.g., 8 bits wide (horizontally).

Tolerating pin failures may become more important with new packaging technologies, such as package-on-package or 3D stacking of memory dies/chips. Other techniques/organizations are possible (e.g., other symbol organizations of arbitrary bit width, besides the 8-bit wide and flat symbol organization example described above). Thus, a memory protection mechanism may be able to tolerate a larger number of failures of pins 122 without a need to increase ECC overhead.

Examples described herein may leverage a symbol-based technique that may use a Reed-Solomon (RS) error correcting code to take advantage of a vertical symbol organization, e.g., using a 1-bit wide 8-bit symbol 132, composed of 8 bursts 134 of 1-bit data. The present examples may target pin failures, and the symbol 132 may be constructed from data from a single pin 122 of the memory 120. Thus, a symbol 132 based on a single pin 122 may be affected by errors of that single pin 122, while being unaffected by errors of other pins 122. Constructing a symbol 132 from output of a single pin 122 may enable a symbol-based error correction code (ECC) to tolerate a larger number of pin failures, without degrading random bit failure performance. Organizing the symbol 132 vertically, to be affected by a single input/output (I/O) pin 122, may maximize I/O pin tolerating capabilities. Bus 102 may include a plurality of channels to carry pin data, and symbol organization may be arranged to accommodate a layout of the bus 102.

Constructing a symbol 132 from a single pin 122 may be facilitated by burst access capabilities in memory 120, e.g., in double data rate (DDRx) dynamic random-access memory (DRAM) systems. DRAM systems may provide n-bit prefetch and burst n access to interface the DRAM core speed with a faster bus speed, where n is 1 for single-data-rate synchronous DRAM (SDRAM), 2 for DDR, 4 for DDR2, and 8 for DDR3, and so on (e.g., DDR4). Thus, burst access may transfer a large data block for a given time window, while DRAM internal core operation is running at a slower rate. Assuming DDR3 (or DDR4), a DRAM access may be made through a burst of multiple bits, such as burst-8 access. Hence, constructing an 8-bit symbol from an 8-burst of 1-bit may be achieved without affecting DRAM scheduling or DRAM access behavior. Thus, the examples described herein may use 64-bit data channels and a single dual in-line memory module (DIMM) per access, and tolerate a larger number of pin failures based on vertical symbol organization.

FIG. 2 is a block diagram of a system 200 including a codeword 230 according to an example. Memory controller 210 is coupled to memory 220 via bus 202 (e.g., a data channel) to transmit the codeword 230. The memory 220 includes a plurality of chips 224 having pins 222. The codeword 230 may include a plurality of symbols 232 (e.g., vertical symbols). A symbol includes a plurality of bursts 234.

Memory 220 demonstrates a type of layout of memory chips 224 and memory channel configuration of pins 222. Memory 220 may be a DRAM module based on a 72-bit wide interface (where 64 bits may be data, and 8 bits may be ECC). If not using ECC, eight chips 224 may be used to provide 64 bits of data, using a channel width of 64 bits. As shown, the channel width is 72 bits, based on 9 x8 DRAM chips 224, providing a x8 ECC memory module configuration. Examples may use other types of chips 224. For example, using x4 DRAM may enable the same channel width shown of 72 bits, by using twice the number of x4 DRAM chips in such a configuration.

ECC schemes may use an SEC-DED implementation, whereby an SEC-DED codeword 231 may be formed as a wide, single-burst 72-bit value. Such SEC-DED mechanisms (not based on symbols), for bit error correction and/or chip failure correction, e.g., based on a wide and flat (e.g., 1-bit tall) codeword 231 using 72-bit wide ECC DIMMs, may have a limited pin-failure tolerance capability. In a memory configuration using the SEC-DED codeword 231, a pin failure would appear as a 1-bit error, hence SEC-DED can tolerate up to 1 pin failure. Although chip-failure tolerance mechanisms can correct more pin failures than the mechanisms based on the SEC-DED codeword 231, such pin failures may be correctable if affecting the same single chip 224, if the memory 220 were configured to have a wide channel configuration with 128-bit data and 16-bit ECC. A symbol-based chipkill-correct memory system using a wide codeword may need a narrow-width DRAM chip (e.g., 4-bit wide chips), along with the wide memory channel (e.g., a 128-bit wide channel, which may be formed by two 64-bit memory modules coupled side-by-side). Some chipkill memory systems may use a wider memory channel, such as a 144-bit wide memory channel, in which case two 72-bit wide channel memory modules are used in parallel to provide the wide codeword.

With multiple memory modules 220 connected in parallel, based on x8 DRAM chips, using Reed-Solomon coding may enable 2 check symbols for those two memory modules to correct one symbol error. Such a technique would use a total of 18 DRAM chips, wherein there would be 16 data DRAM chips and 2 ECC DRAM chips. A memory access would provide (16×8)=128 bits of data, plus (2×8)=16 bits of ECC, enabling 2 check symbol ECC code. Such a code may correct single-symbol errors in the flat codeword 231 with its flat symbols, and can tolerate a chip failure. However, such a technique may be more expensive and require additional power for supporting the additional memory (e.g., 2 memory modules), compared to example memory techniques that use taller symbols that do not need additional modules of memory 220 (and other efficiencies).

However, by using a vertical symbol 232 arrangement, additional overhead or changes in memory access behavior are not needed, and it is possible to have a memory technique to tolerate many more pin failures, providing a more robust technique compared to horizontal symbol arrangements described above regarding the flat codeword 231 and its flat symbols.

FIG. 2 also shows such an example vertical symbol memory scheme, with an 8-bit symbol 232 being constructed using an 8-burst of 1-bit. A symbol-based RS code may be applied, and the codeword 230 may be formed as a 72 byte block having 64 8-bit vertical data symbols and 8 8-bit vertical check symbols. Thus, symbols 232 may include data or check symbols, arranged depending on particular implementations. With such a vertical symbol organization, a pin failure may corrupt a single symbol 232, and that symbol 232 may be corrupted by a single pin 222. Eight check symbols are available, e.g., from an 8-burst output of a single chip 224 that may be used for ECC. Because an 8-check-symbol RS code implementation may correct up to 4 symbol errors, the proposed data/ECC organization may tolerate up to 4 pin failures. Further, if the memory controller 210 corrects a pin failure and then stores an indication of that hard pin failure, the proposed scheme may tolerate an even larger number of pin failures using an erasure coding technique. For example, up to 7 pin failures may be tolerated using erasure coding.

For erasure coding, when encountering a failure, an indication of where exactly the failure occurred may be stored (e.g., by memory controller 210). The next time the memory controller 210 accesses the memory 220, it is known where exactly the failure occurred. That particular failure, whose location is thereby known beforehand, may be referred to as erasure. Erasure correction may be performed using even just one check symbol. Erasure coding may use a Reed Solomon code to locate a symbol 232, and if that symbol 232 has a hard failure, the memory controller 210 may remember the location of that hard failure. The memory controller 210 may access the memory 220 knowing the failure, for tolerating even more pin failures (e.g., examples may tolerate 7 pin failures using 8 check symbols per codeword).

Thus, the proposed vertical symbol scheme can tolerate a larger number of pin failures without a need for wide-channel chipkill-correct configurations. Further, examples may tolerate pin failures without a need for all the failures to be in one DRAM chip, e.g., proposed mechanisms of examples provided herein may tolerate random 4-pin failures. This capability of tolerating a larger number of random pin failures is increasingly valuable as DRAM (or other types of memory) dies or packages are integrated into stacks (3D stacking techniques) sharing pins. In other words, because each pin may be associated with more and more memory chips/dies in future DRAM designs, mechanisms to handle more pin failures become more valuable.

Additionally, example ECC schemes provided herein based on vertical symbol arrangement may tolerate 4 pin failures and may correct a chip failure when 4-bit wide DRAM chips are used. Even when 8-bit wide DRAM chips 224 are used, the proposed schemes may detect a chip failure (e.g., a failure of 8 pins). Examples are expandable beyond the implementation of x8 DRAM chips shown, such as chips in configurations of x4, x8, x16, and so on, such as typical DDR3 DRAM chips. Chips of x32 or other configurations, for example, may be found in other types of memory, such as low power DDR (LPDDR), mobile DDR (mDDR), graphic DDR (GDDR), and other types of memory.

Examples may construct symbols 232 in a vertical manner, so any memory that supports burst memory transactions (e.g., burst 8 or long burst), may use these mechanisms. For example, an n-bit symbol of arbitrary size (e.g., height) may be constructed by forming together n bursts from a memory pin 222. Examples are not restricted to a particular type of memory such as x4, x8, x16, and so on, because all are compatible. In an example, x4 memory may be based on DRAM chips having four I/O pins 222. For a 72-bit wide memory channel of x4 chips, 72 symbols may be produced. Thus. ECC based on this example may tolerate up to 4 symbol errors. Therefore, in that particular example configuration, even if an entire x4 chip has failed, that chip failure may be tolerated, because errors in all four of its pins may be tolerated due to having 72 symbols (which may include, e.g., 8 ECC symbols). The capability of tolerating pin failure is not restricted by a particular chip I/O organization. Tolerating up to 4 pin failures is a capability for memory organizations based on x4, x8, x16, x32 and so on. The I/O pin failure tolerating capability may be defined by a number of check symbols in the constructed ECC codeword 230. In this example, 64 data symbols and 8 check symbols may be used, which may tolerate (e.g., correct) 4 pin failures.

Figure 3A:
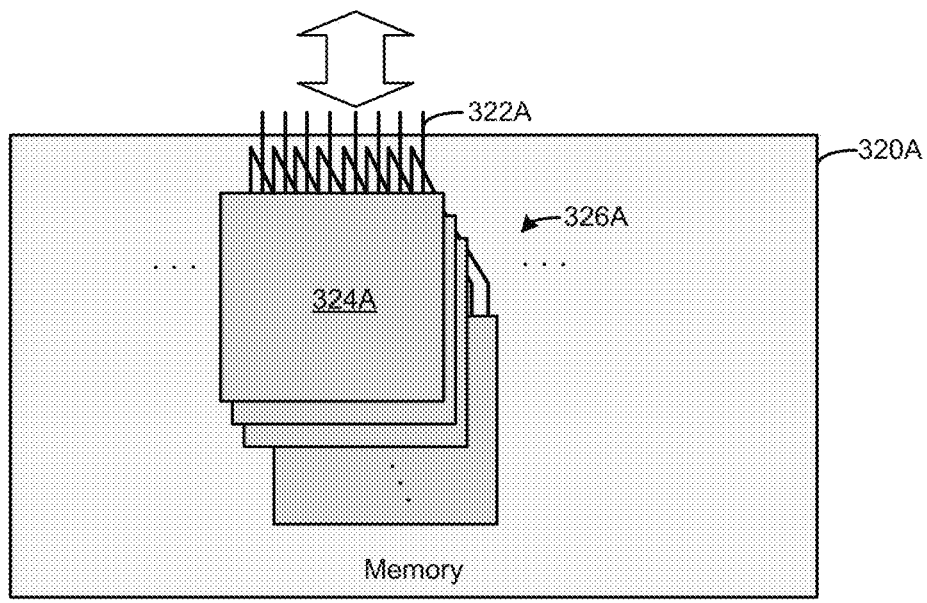
FIG. 3A is a block diagram of a memory according to an example.

FIG. 3A is a block diagram of a memory 320A according to an example. Memory 320A includes a stacked memory structure 326A, formed by a plurality of chips 324A. The plurality of chips 324A may be coupled to each other by common pins 322A.

Figure 3B:
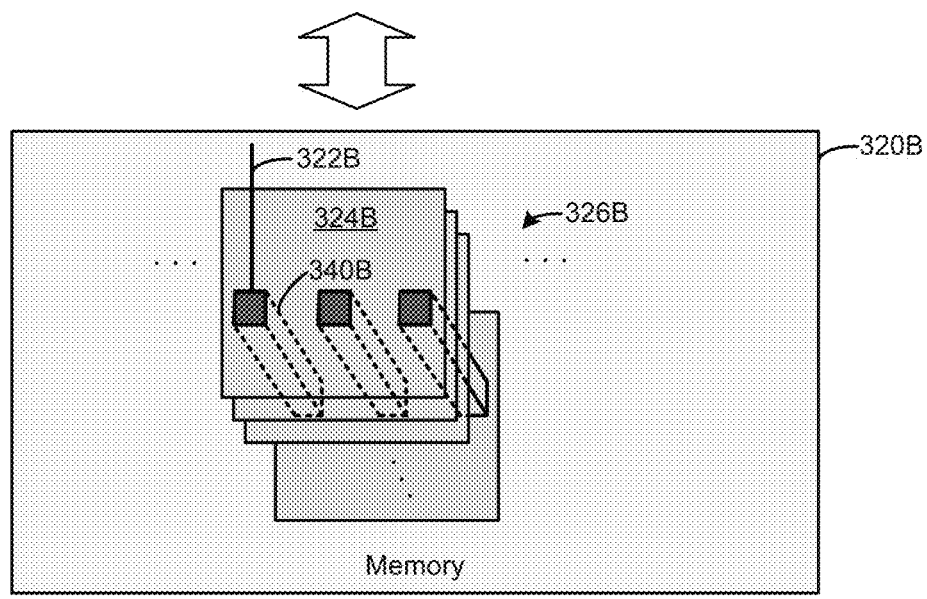
FIG. 3B is a block diagram of a memory according to an example.

FIG. 3B is a block diagram of a memory 320B according to an example. Memory 320B includes a stacked memory structure 326B, formed by a plurality of chips 324B. The plurality of chips 324B may be coupled to each other by common vias 340B (e.g., a through silicon via (TSV)). The vias 340B may communicate with a pin 322B. Although not specifically shown, examples may include additional logic, e.g., between the TSVs and other dies and/or pins. Further, a TSV may or may not be directly connected to a pin (including external pins).

FIGS. 3A and 3B illustrate packaging technologies such as package-on-package (a physical wire connects many DRAM packages) and 3D-stacked memory such as Hybrid Memory Cube (HMC). A failure, such as a pin (or TSV) failure, may affect many of the stacked chips 324A, 324B. A via 340B may vertically connect through the multiple devices, and may carry data transfers as would a wire/pin. For example, the bottom die may be a logic die, and the other stacked dies may be memory dies. Data may be transferred to the bottom logic dies through via 340B, and then transferred to the outside of the device (e.g., through via 340B, out the top or bottom of memory 320B, and/or through pin 322B). The term pin, as used herein, also may refer to a via 340B. Thus, the ability to address pin failures is especially important for such technologies, where one pin may affect a large number of memory components.

Figure 4:
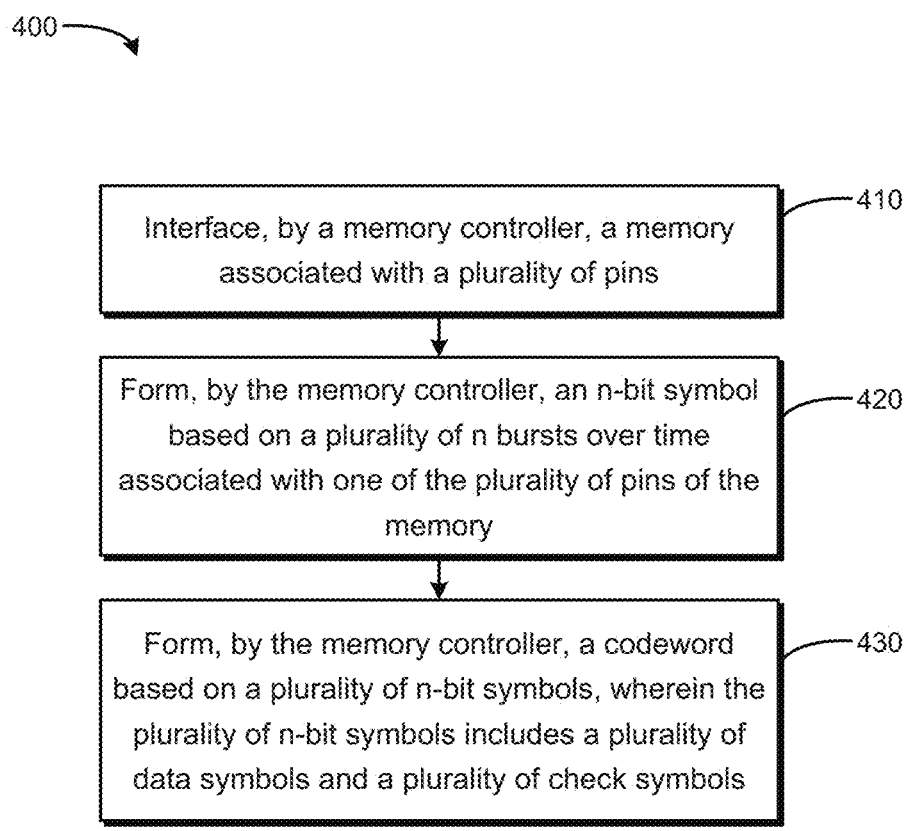
FIG. 4 is a flow chart based on forming a codeword according to an example.

FIG. 4 is a flow chart 400 based on forming a codeword according to an example. In block 410, a memory associated with a plurality of pins is interfaced by a memory controller. For example, the memory controller may be connected by a channel/bus having a bit width to accommodate the memory. In block 420, an n-bit symbol is formed by the memory controller, based on a plurality of n bursts over time associated with one of the plurality of pins of the memory. For example, the memory controller may form one symbol for each pin, resulting in vertical data symbols and vertical check symbols. The increased number of available check symbols for a given channel width may facilitate application of an ECC that uses the check symbols to detect and/or correct errors relating to the data symbols. Further, the narrow pins may be unaffected by pins other than its own single pin. In block 430, a codeword is formed by the memory controller, based on a plurality of n-bit symbols, wherein the plurality of n-bit symbols includes a plurality of data symbols and a plurality of check symbols. The memory controller may use the codeword to ensure functionality of the memory scheme, and may use techniques such as erasure coding to increase a number of tolerated errors.

Those of skill in the art would appreciate that the various illustrative components, modules, and blocks described in connection with the examples disclosed herein may be implemented as electronic hardware, computer software, or combinations of both. Thus, the example blocks of FIGS. 1-4 may be implemented using software modules, hardware modules or components, or a combination of software and hardware modules or components. In another example, one or more of the blocks of FIGS. 1-4 may comprise software code stored on a computer readable storage medium, which is executable by a processor. As used herein, the indefinite articles "a" and/or "an" can indicate one or more than one of the named object. Thus, for example, "a processor" can include one or more than one processor, such as in a multi-core processor, cluster, or parallel processing arrangement. The processor may be any combination of hardware and software that executes or interprets instructions, data transactions, codes, or signals. For example, the processor may be a microprocessor, an Application-Specific Integrated Circuit ("ASIC"), a distributed processor such as a cluster or network of processors or computing device, or a virtual machine. The processor may be coupled to memory resources, such as, for example, volatile and/or non-volatile memory for executing instructions stored in a tangible non-transitory medium. The non-transitory machine-readable storage medium can include volatile and/or non-volatile memory such as a random access memory ("RAM"), magnetic memory such as a hard disk, floppy disk, and/or tape memory, a solid state drive ("SSD"), flash memory, phase change memory, and so on. The computer-readable medium may have computer-readable instructions stored thereon that are executed by the processor to cause a system (e.g., a rate limit manager to direct hardware rate limiters) to implement the various examples according to the present disclosure.

What is claimed is:

1. A system comprising:
a memory comprising a plurality of pins; and
a memory controller to interface with the memory based on a codeword including a plurality of n-bit symbols, wherein an n-bit symbol of the codeword is formed from a burst of a plurality of bits over time output by a single pin of the plurality of pins of the memory,
the memory controller to correct an error of the memory using the n-bit symbol formed from the burst of the plurality of bits, wherein the memory controller stores an indication of a hard pin failure of a first pin of the memory based on a previously corrected pin failure, and tolerates a plurality of pin failures based on the stored indication, a check symbol, and erasure coding.

2. The system of claim 1, wherein the memory includes a plurality of dynamic random-access memory (DRAM) chips, and a respective DRAM chip of the plurality of DRAM chips is associated with a number of symbols corresponding to a number of pins of the respective DRAM chip.

3. The system of claim 1, wherein the memory comprises a 72-pin dual in-line memory module (DIMM), and the codeword includes 64 8-bit vertical data symbols and 8 8-bit vertical check symbols based on burst data transfers, each 8-bit vertical data symbol of the 64 8-bit vertical data symbols formed from a burst of 8 bits from a respective single pin of the DIMM, and each 8-bit vertical check symbol of the 8 8-bit vertical check symbols formed from a burst of 8 bits from a respective single pin of the DIMM.

4. The system of claim 3, wherein the memory controller is to correct up to 4 symbol errors, based on an ECC code and the 8 8-bit vertical check symbols.

5. The system of claim 1, wherein a pin of the plurality of pins of the memory is shared by a plurality of stacked memory dies.

6. The system of claim 1, wherein the plurality of n-bit symbols of the codeword includes an n-bit check symbol for multiple n-bit data symbols.

7. The system of claim 1, wherein the memory comprises a double data rate (DDRx) synchronous dynamic random-access memory (SDRAM), where x is an integer greater than one and corresponds to a burst data transfer rate of n bursts.

8. The system of claim 1, wherein a first n-bit symbol of the plurality of n-bit symbols is formed from a burst of multiple bits output by a first pin of the memory, and a second n-bit symbol of the plurality of n-bit symbols is formed from a burst of multiple bits output by a second pin of the memory, wherein errors in other pins of the plurality of pins other than the first pin do not affect the first n-bit symbol.

9. The system of claim 1, wherein the burst of the plurality of bits over time output by the single pin is part of a burst access of a double data rate (DDR) memory.

10. The system of claim 1, wherein the n-bit symbol formed from the burst of the plurality of bits is a first n-bit symbol formed from the burst of the plurality of bits output by only a first pin of the plurality of pins, and wherein the memory controller is to:

form a second n-bit symbol from a burst of a plurality of bits output by only a second pin of the plurality of pins, and correct the error of the memory using the first and second n-bit symbols.

11. A method comprising:

interfacing, by a memory controller, a memory comprising a plurality of pins;

forming, by the memory controller, an n-bit symbol based on a burst of a plurality of bits over time from a first pin of the plurality of pins of the memory;

forming, by the memory controller, a codeword based on a plurality of n-bit symbols, wherein the plurality of n-bit symbols includes a plurality of data symbols and a plurality of check symbols; and correcting, by the memory controller, an error of the memory using the codeword, wherein the memory controller is to store an indication of a hard pin failure of a first pin of the memory based on a previously corrected pin failure, and tolerate a plurality of pin failures based on the stored indication, a check symbol, and erasure coding.

12. The method of claim 11, further comprising accessing the memory based on a 72-bit wide channel, based on 64-bit data and 8-bit error-correcting code (ECC), to access a single memory module of the memory per access.

13. The method of claim 11, further comprising applying an ECC to the codeword, based on the use of the check symbols.

14. The method of claim 13, wherein the ECC is a Reed-Solomon code.

15. The method of claim 11, wherein the n-bit symbol is based on the burst of the plurality of bits over time from only the first pin, the method further comprising:

forming, by the memory controller, a second n-bit symbol based on a burst of a plurality of bits over time from only a second pin of the plurality of pins, wherein the codeword includes the first and second n-bit symbols.

16. An apparatus comprising:

a memory controller to:

interface a memory having a plurality of pins;

form a first n-bit symbol based on a burst of a plurality of bits over time output by only a first pin of the plurality of pins of the memory, and form a second n-bit symbol based on a burst of a plurality of bits over time output by only a second pin of the plurality of pins of the memory;

form a codeword based on a plurality of n-bit symbols including the first and second n-bit symbols, wherein the plurality of n-bit symbols includes a plurality of data symbols and a plurality of check symbols;

correct an error of the memory using the codeword; and store an indication of a hard pin failure of the first pin of the memory based on a previously corrected pin failure, and tolerate a plurality of pin failures based on the stored indication, a check symbol, and erasure coding.

17. The apparatus of claim 16, wherein the first n-bit symbol is based on a burst of n bits over time output by only the first pin, and the second n-bit symbol is based on a burst of n bits over time output by only the second pin, where n is greater than one.

* * * * *